United States Patent [19]

Fujikura et al.

[11] Patent Number: 5,096,799
[45] Date of Patent: Mar. 17, 1992

[54] PHOTOPOLYMERIZABLE COMPOSITION

[75] Inventors: Sadao Fujikura; Yuichi Wakata; Masayuki Iwasaki, all of Shizuoka, Japan

[73] Assignee: Fuji Photo Film Co., Ltd., Kanagawa, Japan

[21] Appl. No.: 586,105

[22] Filed: Sep. 21, 1990

[30] Foreign Application Priority Data

Sep. 21, 1989 [JP] Japan ............................. 1-245504
Aug. 2, 1990 [JP] Japan ............................. 2-205370

[51] Int. Cl.$^5$ ............................................. G03C 1/725
[52] U.S. Cl. ..................................... 430/281; 430/283; 430/286; 430/288; 522/104; 522/108
[58] Field of Search ............... 430/281, 283, 286, 288; 522/104, 108

[56] References Cited

U.S. PATENT DOCUMENTS 4,311,783  1/1982  Dessauer .......................... 430/270
4,657,942  4/1987  Iwasaki et al. .................... 430/286
4,741,987  5/1988  Tohda et al. ...................... 430/281

Primary Examiner—Marion E. McCamish
Assistant Examiner—Mark A. Chapman
Attorney, Agent, or Firm—Sughrue, Mion, Zinn, Macpeak & Seas

[57] ABSTRACT

A photopolymerizable composition capable of being developed with an aqueous alkali solution, comprising (1) a carboxyl group-containing polymer binder,
(2) a photopolymerization initiator system containing a lophine dimer, and
(3) a carboxy group-containing compound having the weight-average molecular weight of from more than 300 to about 1000 represented by formula (Ia) or (Ib):

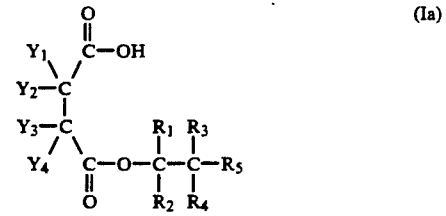

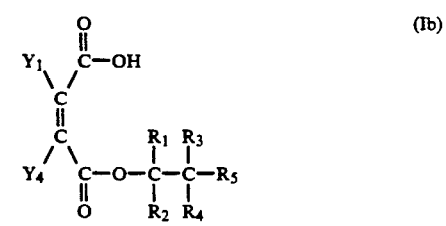

wherein $Y_1$, $Y_2$, $Y_3$, and $Y_4$, which may be the same or different, each represents a hydrogen atom, a halogen atom, an alkyl group having from 1 to 12 carbon atoms, or an aryl group having from 6 to 10 carbon atoms, and with respect to formula (Ib), $Y_1$ and $Y_4$ may form an aromatic hydrocarbon ring having from 6 to 10 carbon atoms, and wherein $R_1$, $R_2$, $R_3$, $R_4$, and $R_5$ each represents a hydrogen atom, an alkyl group having from 1 to 12 carbon atoms, an aryl group having from 6 to 10 carbon atoms, a hydroxyalkyl group having from 1 to 12 carbon atoms, an alkyl group having from 1 to 6 carbon atoms substituted by an alkoxy group having from 1 to 12 carbon atoms or an aryloxy group having from 6 to 10 carbon atoms, A—O—$R_6$— or A—O— (wherein A represents a (meth)acryloyl group and $R_6$ represents an alkylene group having from 1 to 6 carbon atoms or an alkylene glycol group having from 2 to 40 carbon atoms), and (4) photopolymerizable monomer.

18 Claims, No Drawings

PHOTOPOLYMERIZABLE COMPOSITION

FIELD OF THE INVENTION

This invention relates to a photopolymerizable composition containing a carboxy group-containing compound with a specific structure, having the weight-average molecular weight in the definite range. More particularly, the invention relates to an alkali-developable photopolymerizable composition having excellent storage stability while laminated on a metal plate, the composition being suitable for a dry film photoresist or photomask for making printed plate boards, lithographic printing plates, resin reliefs, etc.

BACKGROUND OF THE INVENTION

Dry film resists have been widely used recently for making printed plate boards.

In particular, it has been well known to use a polymer binder having a carboxy group for a dry film resist composition, making it possible to treat the dry film resist with an aqueous alkali solution.

Also, the use of various photopolymerization initiators for dry film resists has been proposed for forming pattern by a photographic process. Among them, lophine dimers described in JP-B-45-37377 and 48-38403 (corresponding to U.S. Pat. No. 3,549,367) (the term "JP-B" as used herein means an "unexamined published Japanese patent application"), JP-A-56-35134 (corresponding to U.S. Pat. Nos. 4,311,783 and 4,252,887) (the term "JP-A" as used herein means an "examined published Japanese Patent Application"), and U.S. patent application Ser. No. 07/391,819 give photopolymerizable compositions having a high sensitivity.

However, when a photoresist using the lophine dimer as a photopolymerization initiator is laminated on a copper layer-applied laminated plate, storage for a long period of time often results in the discoloration of the surface of the copper layer at the unexposed portions revealed by the development into reddish brown (so-called discoloring) and the formation of a development residue (or scum). Although this tendency increases depending on the length of time the laminate is stored, in practice the laminate is allowed to stand for several days before use. Discoloring and the formation of development residue are serious problems since they frequently cause etching residues and plated layer peeling.

To prevent discoloring and/or the formation of development residue, various additives for photopolymerization systems have been proposed. For example, JP-B-58-22486 and JP-A-61-194438 describe the use of low-molecular weight carboxylic acids such as citric acid, malonic acid, etc. In particular, JP-A-61-194438 discloses that the use of low molecular weight carboxylic acids having a molecular weight of not more than 300 is effective.

The addition of these carboxylic acids can reduce discoloring and the formation of development residue. However, if the amount of the carboxylic acid added is too low, a sufficient effect is not obtained, and if a large amount of the carboxylic acid is added to obtain a sufficient effect, the sensitivity of the resist and the alkali resistance of the resist image are reduced. Thus, these carboxylic acids are insufficient as a discoloring inhibitor.

On the other hand, JP-A-62-287240 discloses the use of a compound having a (meth)acryloyl group, an acid value of from 30 to 300, and a weight average molecular weight of from 200 to 2,000, together with a methacrylic acid ester copolymer having a carboxy group on the side chain and a weight average molecular weight of from 100,000 to 400,000 and a photopolymerization initiator for improving the etching resistance of a resist ink composition for etching.

However, the object of that invention is to improve the etching resistance, and there is no description in the specification thereof about the effect of inhibiting discoloring. And, all the compounds described therein have a molecular weight of 300 or less. Furthermore, when a copper plate having the photopolymerizable composition using the compound described in the aforesaid paten specification laminated thereon is stored for a long period of time, granular solid matter forms on the surface of the copper plate. Such solid matter is not removed by development processing and causes serious defects in the etching step and the plating step.

SUMMARY OF THE INVENTION

An object of this invention is to provide a photopolymerizable composition having high sensitivity and showing good adhesion on to a metal plate, the photopolymerizable composition containing a lophine dimer as a photopolymerization initiator and being developable with an aqueous alkali solution. Also, the composition should prevent discoloring, the formation of development residue and granular solid matter on the surface of the metal plate, and the reduction of the sensitivity which are caused by storage in the state of being laminated on a metal plate.

As a result of various investigations, the inventors have discovered a photopolymerizable composition capable of attaining these objects.

That is, according to this invention, there is provided a photopolymerizable composition capable of being developed with an aqueous alkali solution, comprising (1) a carboxy group-containing polymer binder,
(2) a photopolymerization initiator system containing a lophine dimer,
(3) a carboxy group-containing compound having the weight-average molecular weight of from more than 300 to about 1,000 represented by formula (Ia) or (Ib):

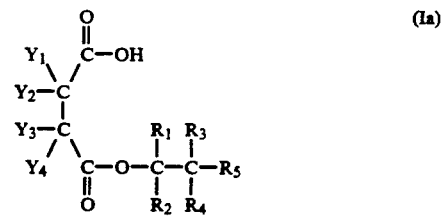

(Ia)

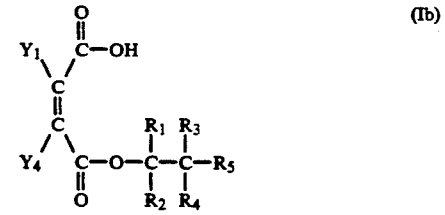

(Ib)

wherein $Y_1$, $Y_2$, $Y_3$, and $Y_4$, which may be the same or different, each represents a hydrogen atom, a halogen atom such as chlorine, bromine and iodine, an alkyl group having from 1 to 12 carbon atoms, or an aryl group having from 6 to 10 carbon atoms, and with respect to formula (Ib), $Y_1$ and $Y_4$ may form an aromatic hydrocarbon ring having from 6 to 10 carbon atoms, wherein the aromatic hydrocarbon ring may have a carboxy group directly bonded thereto, and wherein $R_1$, $R_2$, $R_3$, $R_4$, and $R_5$ each represents a hydrogen atom, an alkyl group having from 1 to 12 carbon atoms, an aryl group having from 6 to 10 carbon atoms, a hydroxyalkyl group having from 1 to 12 carbon atoms, an alkyl group having from 1 to 6 carbon atoms substituted by an alkoxy group having from 1 to 12 carbon atoms or an aryloxy group having from 6 to 10 carbon atoms, A—O—$R_6$— or A—O— (wherein A represents a (meth)acryloyl group and $R_6$ represents an alkylene group having from 1 to 6 carbon atoms or an alkylene glycol group having from 2 to 40 carbon atoms), and (4) a photopolymeriable monomer.

DETAILED DESCRIPTION OF THE INVENTION

The technical basis for the effect of this invention has not yet been clarified but is considered to be as follows.

That is, the effect of inhibiting discoloring is considered to be based on the large interaction between the compound with the specific structure shown by formula (Ia) or (Ib) and the metal plate. In addition, the binder for the photopolymerizable composition has a carboxy group to be alkali-soluble. Also, it is surprisingly found that the compound with the molecular weight of more than 300 represented by formula (Ia) or (Ib) restrains the formation of granular solid matter on the metal plate, although the mechanism has not ye been clarified.

The carboxy group-containing polymer binder is selected from the wide variety of synthetic, semi-synthetic, and natural polymers which satisfy the following conditions.

That is, the polymer has a good compatibility with a photopolymerizable monomer and the photopolymerization initiator system, and it does not cause the mixture to separate in the production steps from the preparation of the coating composition, to drying the composition and during the storage of the mixture obtained. The polymer binder has properties according to the manner of use of the photopolymerizable composition. For example, when the composition is used for a tinting photoresist, the binder for the composition must be adequate in strength, spreading property, abrasion resistance, and chemical resistance. Furthermore, the binder must also be adequate in molecular weight, intermolecular force, hardness, softening temperature, crystallinity and ductility (see JP-A-61-228067 and 63-147159).

Specific examples of the binder for use in this invention are copolymers of (meth)acrylic acid and (meth)acrylic acid alkyl ester (examples of the alkyl group are methyl, ethyl, and butyl), poly(meth)acrylic acid, copolymers of styrene and an unsaturated dibasic acid anhydride such as maleic anhydride, etc., reaction products of the aforesaid polymer and an alcohol, and reaction products of the aforesaid polymer and a polybasic acid anhydride of cellulose.

Also, examples of particularly suitable polymers of the aforesaid polymers are styrene/maleic anhydride copolymers, quaternary copolymers of methyl methacrylate, methacrylic acid, 2-ethylhexyl methacrylate, and benzyl methacrylate as described in JP-A-60-25839, styrene/maleic acid mono-butyl ester copolymers a described in JP-B-55-8961, quaternary copolymers of styrene, methyl methacrylate, ethyl acrylate, and methacrylic acid as described in JP-B-54-5957, benzyl methacrylate/methacrylic acid copolymers as described in JP-A-52-99810 (corresponding to U.S. Pat. No. 4,139,391), ternary copolymers of acrylonitrile, 2-ethylhexyl methacrylate, and methacrylic acid as described in JP-B-58-12577, and ternary copolymers of methyl methacrylate, ethyl acrylate, and acrylic acid and styrene/maleic acid copolymers partially esterified with isopropanol as described in JP-B-55-6210.

The aforesaid binders may be used singly, or two or more kinds of the aforesaid polymers which are compatible with each other and do not cause the mixture to separate in the steps from the preparation of the coating composition to coating and drying thereof, and during the storage of the mixture obtained, may be used as a mixture thereof at a proper mixing ratio.

The molecular weight of the polymer which is used as the binder for the photopolymerizable composition of this invention can be within a wide range determined according to the kind of the polymer, but it is generally from 5,000 to 2,000,000, preferably from 10,000 to 200,000, and more preferably from 40,000 to 85,000.

If the molecular weight of the binder is less than abut 5,000, the mechanical strength of the resist obtained by photopolymerizing the composition is insufficient, while if the molecular weight is over about 2,000,000, the developability of the resist is reduced.

The amount of the binder present is preferably from 40 to 90% by weight, and more preferably from 50 to 70% by weight, based on the amount of the solid components of the photopolymerizable composition. If the amount thereof is less than about 40% by weight, the fluidity of the photopolymerizable composition is too high, which results in the creep phenomenon, while if the amount is over about 90% by weight, the difference in solubility between the exposed portions and unexposed portions of the resist become too small to obtain good image quality Preferred lophine dimers which are used as photopolymerization initiators in this invention are those described in the aforesaid JP-B-45-37377 and 48-38403, JP-A-56-35134, and Japanese Patent Application 63-200605.

Specific examples of the lophine dimer are 2-(o-chlorophenyl)-4,5-diphenylimidazole dimer, 2-(o-chlorophenyl-4,5-di(m-methoxyphenyl)imidazole dimer, 2-(o-fluorophenyl)-4,5-diphenylimidazole dimer, 2-(o-methoxyphenyl)-4,5-diphenylimidazole dimer, and 2-(p-methoxyphenyl)-4,5-diphenylimidazole dimer.

These lophine dimers can be used singly, but they are preferably used together with the following photopolymerization initiator.

That is, the photopolymerization initiator which can be suitably used together with the aforesaid lophine dimers contains at least one kind of component having a molecular extinction coefficient of at least about 50 in the wavelength range of from about 300 to 800 nm, and preferably from about 330 to 500 nm. Examples of such a photopolymerization initiator are aromatic ketones, benzoin, benzoin ethers, polyhalogens, and combinations thereof.

Specific examples of such a photopolymerization initiator are as follows.

The aromatic ketons include, for example, benzophenone, 4,4'-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzil, anthraquinone, 2-tert-butylanthraquinone, 2-methylanthraquinone, xanthone, thioxanthone, 2-chlorothio xanthone, 2,4-diethylthioxanthone, fluorenone, and acridone.

Benzoin ethers include, for example, benzoin methyl ether, benzoin ethyl ether, benzoin isopropyl ether, and benzoin phenyl ether.

Polyhalogen compounds include, for example, carbon tetrabromide, phenyltribromomethylphenylsulfone, phenyltrichloromethyl ketone, and the compounds described in JP-A-53-133428 (corresponding to U.S. Pat. No. 4,189,323), JP-B-57-1819 (corresponding to U.S. Pat. No. 3,987,037) and 57-6096 (corresponding to U.S. Pat. Nos. 4,212,970 and 4,232,106), and U.S. Pat. No. 3,615,455.

Particularly preferred examples thereof are 4,4'-bis(dimethylamino)benzophenone, 4,4'-bis(diethylamino)benzophenone, 2,4-diethylthioxanthone, a combination of 4,4'-bis(diethylamino)benzophenone and benzophenone, and a combination of 4,4'-bis(diethylamino)benzophenone and phenyltribromomethylphenylsulfone.

The amount of the lophine dimer or the lophine dimer and other photopolymerization initiator to be used together with the lophine dimer is preferably from 0.1 to 20% by weight, and more preferably from 0.2 to 10% by weight, based on the amount of the solid components of the photopolymerizable composition. If the amount thereof is less than about 0.1% by weight, the sensitivity of the photopolymerizable composition is insufficient, and if the amount is over about 20% by weight, the existence of the compound(s) has a detrimental effect on the properties of the film or layer of the photopoymerizable composition. Thus, the amount outside the aforesaid range is unsuitable for the object of this invention.

When the lophine dimer is used together with a photopolymerization initiator than the lophine dimer, there is no restriction on the ratios of them.

Examples of the carboxy group-containing compound represented by formula (Ia) or (Ib) for use in this invention, include the addition reaction product of 1-(meth)acryloyloxy-2-butanol and an acid anhydride such as phthalic acid, succinic acid, maleic acid, trimellitic acid, etc., examples of the addition reaction product being 1-ethyl-2-(meth)acryloyloxyethyl hydrogenphthalate, 1-ethyl-2-(meth)acryloyloxyethyl hydrogensuccinate, 1-ethyl-2-(meth)acryloyloxyethyl hydrogenmaleate, and 1-ethyl-2-(meth)acryloyloxyethyloxycarbonylbenzenedicarboxylic acid; the addition reaction product of 1,3-(meth)acryloyloxy-2-propanol and an aforesaid acid anhydride, examples of the addition reaction product being 1-(meth)-acryloyloxymethyl-2-(meth)acryloyloxyethyl hydrogenphthalate, 1- (meth)acryloyloxymethyl-2-(meth)acryloyloxyethyl hydrogensuccinate, 1-(meth)acryloyloxymethyl-2-(meth)acryloyloxyethyl hydrogenmaleate, and 1-(meth)acryloyloxy-methyl-2-(meth)acryloyloxyethyloxycarbonylbenzenedicarboxylic acid; the addition reaction product of trimethylolethane tri(meth)acrylate and an aforesaid acid anhydride, examples of the addition reaction product being 2,2-bis((meth)acryloyloxymethyl)propyl hydrogenphthalate, 2,2-bis((meth)acryloyloxymethyl)propyl hydrogensuccinate, 2,2-bis((meth)acryloyloxymethyl)propyl hydrogenmaleate, and 2,2-bis((meth)acryloyloxymethyl)propyloxycarbonylbenzenedicarboxylic acid; the addition reaction product of trimethylolpropane tri(meth)acrylate and an aforesaid acid anhydride, examples of the addition reaction product being 2,2-bis((meth)acryloyloxymethyl)butyl hydrogenphthalate, 2,2-bis((meth)acryloyloxymethyl)butyl hydrogensuccinate, 2,2-bis((meth)acryloyloxymethyl)butyl hydrogenmaleate, and 2,2-bis((meth)acryloyloxymethyl)butyloxycarbonylbenzenedicarboxylic acid; the addition reaction product of pentaerythritol tri(meth)acrylate and an aforesaid acid anhydride, examples of the addition reaction product being 2,2,2-tris((meth)acryloyloxymethyl)ethyl hydrogenphthalate [NK Ester CBX-1 (trade name, made by Shin Nakamura Kagaku Kogyo K.K.)], 2,2,2-tris((meth)acryloyloxymethyl)ethyl hydrogensuccinate, 2,2,2-tris(-(meth)acryloyloxymethyl)ethyl hydrogenmaleate, and 2,2,2-tris((meth)acryloyloxymethyl)ethyloxycarbonylbenzenedicarboxylic acid; the addition reaction product of 1-(meth)acryloyloxy-3-phenoxy-2-propanol and an aforesaid acid anhydride, examples of the addition reaction product being 1-phenoxymethyl-2-(meth)acryloyloxyethyl hydrogenphthalate, 1-phenoxymethyl-2-(meth)acryloyloxyethyl hydrogensuccinate, 1-phenoxymethyl-2-(meth)acryloyloxyethyl hydrogenmaleate, and 1-phenoxymethyl-2-(meth)acryloyloxyethyloxycarbonylbenzenedicarboxylic acid; a phthalic acid, succinic acid, maleic acid, or trimerithic acid monoester of alcohols having from 4 to 40 carbon atoms or polyethylene glycol mono(meth)acrylate having from 4 to 40 carbon atoms; and a phthalic acid, succinic acid, maleic acid, or trimerithic acid monoester of polypropylene glycol mono (meth)acrylate having from 6 to 40 carbon atoms.

These carboxy group containing compounds may be used singly or as a combination thereof.

The amount of the carboxy group-containing compound shown by formula (Ia) or (Ib) present is from 0.1 to 40% by weight, and preferably from 0.2 to 20% by weight, based on the amount of the solid components of the photopolymerizable composition. If the amount is less than about 0.1% by weight, the effect of inhibiting discoloring is weak, while if the amount is over about 40% by weight, the alkaline developer resistance of the resist image is reduced, whereby good resist images are not obtained.

Also, in the case of using the caboxy group-containing compound shown by formula (Ia) or (Ib), there is not restriction on the weight ratio thereof. Furthermore, the carboxy group-containing compound represented by formula (Ia) or (Ib) has the weight-average molecular weight in the range of from more than 300 to about 1,000. If the molecular weight of the compound (Ia) or (Ib) is less than 300, when the metal plate such as copper, having the photopolymerizable composition laminated thereon is stored for a long period of time, granular solid matter forms on the surface thereof. If it is more than about 1,000, effect to reduce discoloring becomes weak.

The photopolymerizable monomers which can be used in the present invention include (meth)acrylic acid esters described in JP-A-60-258539 and Japanese Patent Application 1-91247.

Specific examples of the monomer are (meth)acrylic acid esters of polyols, such as diethylene glycol di(meth)acrylate, triethylene glycol di(meth)acrylate, tetraethylene glycol di(meth)acrylate, nonaethylene glycol di(meth)acrylate, tetradecaethylene glycol di(meth)acrylate, nonapropylene glycol di(meth)acrylate, dodecapropylene glycol di(meth)acrylate, trimethylolpropane tri(meth)acrylate, tri(meth)acrylate of an ethylene oxide addition product of trimethylolpropane, pentaerythritol di(meth)acrylate, pentaerythritol tri(meth)acrylate, pentaerythritol tetra(meth)acrylate, dipentaerythritol hexa(meth)acrylate, glycerol di(meth)acrylate, and 1,3-propanediol di(meth)acrylate; (meth)acrylamides such as methylene bis(meth)acrylamide and poly(meth)acrylamides induced from ethylenediamine, diaminopropane, diaminobutane, pentamethylenediamine, bis(2-aminopropyl)amine, diethylenetriaminediamine, phenylenediamine, diaminobenzoic acid, etc.; allyl compounds such as diallyl esters of phthalic acid, malonic acid, etc., and diallyl esters of benzenedisulfonic acid, 2,5-dihydroxydisulfonic acid, etc.; vinyl ether compounds such as ethylene glycol divinyl ether, 1,3,5-tri-$\beta$-vinyloxyethoxybenzene, etc.; vinyl esters such as divinyl succinate, divinyl adipate, etc.; and styrene compounds such as divinylbenzene, p-allylstyrene, etc.

Furthermore, polyfunctional urethane compounds having at least two ethyleneically unsaturated groups obtained by reacting a compound having at least one hydroxy group and at least one ethylenically unsaturated group with the reaction product obtained by reacting a polyol compound having at least two hydroxy groups and a slightly excessive amount of polyisocyanate compound having at least two isocyanate groups can be also used as the aforesaid monomer (see JP-B-48-43657, 50-34964 and 56-17654).

The amount of the photopolymerizable monomer is about from 10 to 60% by weight, and preferably from 25 to 50% by weight, based on the amount of the solid components of the photopolymerizable composition. If the amount is less than about 10% by weight, the difference in solubility between the exposed portions and the unexposed portions is too small to obtain a good image quality, while if the amount is over about 60% by weight, the fluidity of the photopolymerizable composition is too high, which results in the creep phenomenon.

The photopolymerizable composition of this invention is composed of the carboxy group-containing polymer binder, the photopolymerization initiator system containing the lophine dimer, the carboxy group-containing compound shown by formula (Ia) or (Ib) and the photopolymerizable monomer. However, if desired, the composition may further contain a thermal polymerization inhibitor, a plasticizer, a dye, a discoloring agent, an adhesion accelerator, etc., whereby desired photoresists, resin relief printing plates, lithographic printing plates, photomasks, etc., can be desirably prepared. The aforesaid additives are described blow in further detail.

A thermal polymerization inhibitor is used for inhibiting the photopolymerizable composition from thermally polymerizing or polymerizing with the passage of time. By the addition thereof, the chemical stability of the photopolymerizable composition during preparation and storage is enhanced.

Specific example of the thermal polymerization inhibitor are p-methoxyphenol, hydroquinone, benzoquinone, o-toluquinone, p-toluquinone, t-butylcatechol, pyrogallol, 2-hydroxybenzophenone, 4-methoxy-2-hydroxybenzophenone, cuprous chloride, phenothiazine, phloranyl, chloranyl, naphthylamine, pyridine, p-toluidine, $\beta$-naphthol, 2,6-di-t-butyl-p-cresol, nitrobenzene, dinitrobenzene, picric acid, the aluminum salt or ammonium salt of N-nitrosophenylhydroxylamine, methylene blue organic cooper, methyl salicylate, and aryl phosphite.

The amount of the thermal polymerization inhibitor present is preferably from 0.001 to 10% by weight, and more preferably from 0.01 to 3% by weight, based on the amount of the solid components of the photopolymerizable composition. If the amount is less than about 0.001% by weight, the thermal stability of the photopolymerizable composition is inferior, and if the amount is over about 10% by weight, the sensitivity of the composition is reduced.

A plasticizer is used for controlling the quality of the layer or film of the photopolymerizable composition before or after light hardening and for controlling other properties such as light sensitivity, etc., thereof.

Specific examples of a plasticizer which can be used in this invention are phthalic acid esters such as dibutyl phthalate, diheptyl phthalate, dioctyl phthalate, diallyl phthalate, etc.; glycol esters such as trimethylene glycol diacetate, tetraethylene glycol diacetate, etc.; acid amides such as p-toluenesulfonamide, benzenesulfonamide, N-n-butylbenzenesulfonamide, etc.; aliphatic dibasic acid esters such as diisobutyl adipate, dioctyl azelate, dibutyl maleate, etc.; tributyl citrate, glycerol triacetate, butyl laurate, and dioctyl 4,5-diepoxycyclihexane-1,2-dicarboxylate.

The amount of the plasticizer present is preferably from 0.001 to 50% by weight, and more preferably from 0.01 to 20% by weight, based on the amount of the solid components of the photopolymerizable composition. If the amount is over about 50% by weight, the plasticizer has a detrimental effect on the developability and the image quality. On the other hand, if the amount is less than about 0.001% by weight, the plasticizing effect is not sufficient.

A dye is used for coloring the photopolymerizable composition.

Specific examples of the dye are Malachite Green, Methyl Green, Brilliant Green, Methyl Violet, Crystal Violet, Ethyl Violet, Victoria Pure Blue BOH, OIL BLUE #603 (trade name, made by Orient Kagaku Kogyo K.K.), Eosine, Erythrosine B, Rose Bengal, Rhodamine B, Rhodamine 6G, 2,7-dichlorofluoresceine, phenolphthalein, Alizarine Red S, Thymolphthalein, Quinaldine Red, Methanyl Yellow, Thymolsulfophthalein, diphenyltriazene, Xylenol Blue, Methyl Congo Red, diphenylthiocarbazone, Paramethyl Red, Congo Red, Benzofulpurine 4B, $\alpha$-Naphthyl Red, Nile Blue A, Phenacetarine, Para-Fuchsine, and Basic Fuchsine.

The amount of the dye present is preferably from 0.001 to 10% by weight, and more preferably from 0.1 to 5% by weight, based on the amount of the solid components of the photopolymerizable composition. If the amount is over about 10% by weight, the dye has a detrimental effect on the sensitivity of the photopolymerizable composition. If the amount is less than about 0.001% by weight, the practical color density is not obtained.

A discoloring agent is used for obtaining a visible image when the layer of the photopolymerizable composition is irradiated with light through a photomask.

Specific examples of the discoloring agent are the dyes described above, as well as diphenylamine, dibenzylaniline, triphenylamine, diethylaniline, diphenyl-p-phenylenediamine, p-toluidine, 4,4'-biphenyldiamine, o-chloroaniline, p,p',p''-hexamethyltriaminotriphenylmethane, p,p'-tetramethyldiaminotriphenylmethane, and p,p',p''-triaminotriphenylcarbinol.

The amount of the discoloring agent present is preferably from 0.001 to 10% by weight, and more preferably from 0.01 to 5%, by weight based on the amount of the solid components of the photopolymerizable composition. If the amount is over about 10% by weight, the composition is liable to cause a reduction in sensitivity and the formation of fog. If the amount is less than about 0.001% by weight, the change in color is reduced not to obtain a practical image.

An adhesion accelerator is used for increasing the adhesive property of the photopolymerizable composition onto the surface of a metal plate, such as a copper plate, a stainless steel plate, an anodically oxidized aluminum plate, a silicon plate, etc.

Examples of the adhesion accelerator are benzimidazole, benzothiazole, and benzotriazole as described in JP-B-50-9177 (corresponding to U.S. Pat. No. 3,622,334), 2-mercaptobenzothiazole and 2-mercaptobenzimidazole as described in JP-A-53-702, and the compounds described in JP-A-59-113432 (corresponding to U.S. Pat. No. 4,572,888), 59-16501, 60-12543 and -12544 (corresponding to U.S. Pat. No. 4,543,318), and 61-172139 (corresponding to U.S. Pat. No. 4,657,942).

The amount of the adhesion accelerator present is preferably from 0.001 to 10% by weight, and more preferably from 0.01 to 5%, by weight, based on the amount of the solid components of the photopolymerizable composition. If the amount is over about 10% by weight, it causes the formation of development residue. If the amount is less than about 0.001% by weight, the increase in adhesive property of the composition is not sufficient.

One can form a resist image with the photopolymerizable composition of this invention by laminating a layer of the composition on a base plate, imagewise exposing the layer, and developing it to dissolve off the layer at the unexposed portions. The layer of the photopolymerizable composition can be developed by an aqueous alkali solution. An aqueous solution of about 0.1 to 10% by weight sodium hydroxide, potassium hydroxide, lithium hydroxide, sodium carbonate, potassium carbonate, lithium carbonate, ammonia, etc., can be used as the developer, but as the case may be, amines (for example, primary amines such as butylamine, hexylamine, benzylamine, allylamine, etc.; secondary amines such as diethylamine, benzylethylamine, etc.; tertiary amines such as triethylamine, etc.; hydroxylamines such as ethanolamine, diethanol amine, triethanolamine, 2-amino-1,3-propanediol, etc., and cyclic amines such as morphiline, pyridine, piperazine, piperidine, etc.), as well as the basic salts (such as sulfates, carbonates, hydrogencarbonates, alkali metal phosphates, pyrophosphates, etc.) and hydroxides (such as tetramethylammonium hydroxide, choline, etc.) of the aforesaid amines, can also be used for the developer.

The following examples are intended to explain the invention more practically, but they are not intended to limit it in any way. All parts in these examples, unless otherwise indicated, are by weight.

EXAMPLES 1 TO 7 AND COMPARISON EXAMPLES 1 TO 11

The following components were mixed to provide a uniform solution.

| | |
|---|---|
| Methyl methacrylate/methacrylic acid/2-ethylhexyl acrylate/benzyl methacrylate copolymer (mol ratio = 55/28/12/5, weight average mol. weight = 79,000, 35 wt. % solution of the copolymer, the solvent being a 2/1 mixture of methyl ethyl ketone and 1-methoxy-2-propanol) | 45 parts |
| Dodecapropylene glycol diacrylate | 6.5 parts |
| Tetraethylene glycol dimethacrylate | 1.5 parts |
| p-Toluenesulfonamide | 0.5 part |
| 4,4'-Bis(diethylamine)benzophenone | 0.05 part |
| Benzophenone | 1.0 part |
| 2-(2'Chlorophenyl)-4,5-diphenyl-imidazole dimer (25 wt. % dichloromethane solution) | 2.0 parts |
| Tribromomethylphenylsulfone | 0.1 part |
| Leuco Crystal Violet | 0.1 part |
| Malachite Green | 0.01 part |

To the solution thus obtained was added each of the carboxy group-containing compounds represented by formula (Ia) or (Ib) (Examples 1 to 6) as shown in Table 1 below, or each of low-molecular weight carboxylic acids having a molecular weight of less than 300 (citric acid or malonic acid) described in JP-A-61-194438 (Comparison Examples 2 to 4), each of carboxy group-containing compounds described in JP-A-62-287240 (Comparison Examples 5 to 10) or a carboxy group-containing compound not having (meth)acryloyl group, with a molecular weight of less than 300 as shown respectively in Table 1 below.

Furthermore, each of the mixtures was stirred to dissolve each additive, coated on a polyethylene terephthalate temporary support having a thickness of 20 μm, and dried for 2 minutes at 100° C. to provide a light-sensitive material having the coated layer of the light-sensitive resin being about 40 μm in thickness. The light-sensitive material was laminated onto a cleaned copper layer-applied laminated plate (copper layer thickness: 35 μm) at 105° C. Two such laminates were prepared for each composition.

One laminate was allowed to stand for 4 days at 23° C. and 65% RH under light-shading. The other laminate was exposed, after 15 minutes, to a super high pressure mercury lamp of 5 kW [HMW-532D (trade name, made by ORC K.K.)] at various exposure amounts through each of two kinds of negative originals (chart A, chart B).

Chart A: Line width/space width (L/S)=$\frac{1}{1}$, line width=30 μm to 100 μm [10 μm step, 5 lines with each width]

Chart B: FUJI STEP GUIDE P [step difference of density: 0.15 (trade name, made by Fuji Photo Film Co., Ltd.)]

Fifteen minutes after the exposure, the temporary support was separated from the coated layer, leaving the coated layer on the copper layer. The coated layer was subjected to spray development with an aqueous 1% sodium carbonate solution at 30° C. for 40 seconds, and washed with water at 20° C. for 40 seconds.

The resist patterns on the originals A and B thus obtained were observed visually and with an optical microscope. The evaluations were as follows.

Sensitivity

The clear step number in the pattern of chart B obtained in the case of exposure at 100 mj/cm² was defined as the sensitivity. In this evaluation, the larger the clear step number was, the higher the sensitivity was.

Adhesion

The pattern of chart A obtained in the case of exposure at the amount at which the eighth clear step was observed and the line width of each of five thinnest lines remaining without being twisted or peeled was recorded as the adhesion. In the evaluation, the thinner the line width was, the higher the adhesion was.

Also, the performance of the laminates with the passage of time was evaluated as follows.

After lamination, each sample was allowed to stand for 4 days at 23° C. and 65% RH under light-shading and was processed in the same manner as above. Each sample was evaluated as follows.

Sensitivity

Same as described above.

Discoloring

The color of the non-imaged portion of the pattern obtained by exposure using chart A, followed by developing, was visually observed. Less occurrence of red-brown discoloring was better.

Granular Solid Matter

The non-image portion of the pattern obtained by exposure using chart A, followed by developing, was observed with a microscope, and the existence of the granular solid matter was confirmed.

Etching Property

After observing the discoloring and the formation of granular solid matter, each sample was etched under the following etching condition. If copper did not remain on the non-image portion of the sample thus etched, the sample was defined a good sample.

The etching condition was as follows.

Composition of the etching solution:

400 g/l of copper chloride dihydrate and 100 g/l of 35% hydrochloric acid.

The temperature of the etching solution was 45° C., the spraying pressure was 2.0 kg/cm$^2$, the etching time was 2.0 minutes, and the washing time was 2.0 minutes.

The results thus obtained are shown in Table 2 below.

TABLE 1

| Example | Compound | Amount (parts) | Molecular Weight |
|---|---|---|---|
| Example 1 | 1-Ethyl-2-methacryloyloxyethyl hydrogenphthalate | 0.5 | 306 |
| Example 2 | 1-Acryloyloxymethyl-2-acryloyloxypropyl hydrogensuccinate | 0.5 | 314 |
| Example 3 | 2,2-Bis(methacryloyloxymethyl) butane hydrogenphthalate | 0.5 | 418 |
| Example 4 | 1-Phenoxymethyl-2-acryloyloxyethyl hydrogensuccinate | 0.5 | 317 |
| Example 5 | 2,2,2-Tris(acryloyloxymethyl)ethyl hydrogenphthalate | 0.5 | 446 |
| Example 6 | 2,2,2-Tris(methacryloyloxymethyl)ethyl hydrogensuccinate | 0.5 | 440 |
| Example 7 | 3-Ethyl-1-isobutylheptyl hydrogenphtahlate | 0.5 | 348 |
| Comparison Example 1 | none | — | — |
| Comparison Example 2 | Citric acid | 0.05 | 192 |
| Comparison Example 3 | Citric acid | 0.5 | 192 |
| Comparison Example 4 | Malonic acid | 0.05 | 104 |
| Comparison Example 5 | 2-Acryloyloxyethyl hydrogenphthalate | 0.5 | 264 |
| Comparison Example 6 | 2-Acryloyloxyethyl hydrogensuccinate | 0.5 | 216 |
| Comparison Example 7 | 2-Acryloyloxyethyl hydrogenmaleate | 0.5 | 214 |
| Comparison Example 8 | 1-Methyl-2-methacryloyloxyethyl hydrogensuccinate | 0.5 | 244 |
| Comparison Example 9 | 2-Acryloyloxyethyl 1,2,3,6-tetrahydrohydrogenphthalate | 0.5 | 268 |
| Comparison Example 10 | 2-Acryloyloxyethyl dihydrogenphosphate | 0.5 | 196 |
| Comparison Example 11 | n-heptyl hydrogen phthalate | 0.5 | 264 |

TABLE 2

| | Sensitivity | | Adhesion (line width μm) | Discoloring | Granular solid matter | Etching property |
|---|---|---|---|---|---|---|
| | 15 minutes after lamination | 4 days after lamination | | | | |
| Example 1 | 9th step | 9th step | 40 | none | none | good |
| Example 2 | 9th step | 9th step | 40 | none | none | good |
| Example 3 | 9th step | 9th step | 40 | none | none | good |
| Example 4 | 9th step | 9th step | 40 | none | none | good |
| Example 5 | 9th step | 9th step | 40 | none | none | good |
| Example 6 | 9th step | 9th step | 40 | none | none | good |
| Example 7 | 9th step | 9th step | 40 | none | none | good |
| Comparative Example 1 | 9th step | 9th step | 40 | Red brown | none | no good (copper residue formed) |
| Comparative Example 2 | 9th step | 8th step | 60 | Red brown | none | no good (copper residue formed) |
| Comparative Example 3 | 8th step | 6th step | 80 | none | none | good |
| Comparative Example 4 | 8th step | 8th step | 60 | Red brown | none | no good (copper residue formed) |
| Comparative Example 5 | 9th step | 9th step | 40 | none | formed | no good (copper residue formed) |
| Comparative Example 6 | 9th step | 9th step | 40 | none | formed | no good (copper residue formed) |
| Comparative Example 7 | 9th step | 8th step | 40 | none | formed | no good (copper residue formed) |
| Comparative Example 8 | 9th step | 8th step | 40 | none | formed | no good (copper residue formed) |
| Comparative Example 9 | 9th step | 9th step | 40 | Red brown | none | no good (copper residue formed) |
| Comparative Example 10 | 3rd step | 0 | — | none | none | — |
| Comparative Example 11 | 9th step | 9th step | 40 | none | formed | no good (copper |

TABLE 2-continued

| | Sensitivity | | Adhesion | | | |
|---|---|---|---|---|---|---|
| | 15 minutes after lamination | 4 days after lamination | (line width μm) | Discoloring | Granular solid matter | Etching property |
| Example 11 | | | | | | residue formed) |

As shown in Table 1, it can be seen that even when the photopolymerizable composition of this invention containing the carboxy group-containing compound represented by formula (Ia) or (Ib) was laminated on a copper layer-applied laminated plate and the laminate is stored for a long period of time, the composition did not cause (1) discoloring, (2) a reduction in sensitivity, and (3) the formation of granular solid matter, and provided (4) a good etching property.

Furthermore, in the evaluation made directly after laminating the photopolymerizable composition on a copper layer-applied laminated plate, the composition of this invention was superior in (5) high sensitivity and (6) a good adhesion of the resist pattern, in comparison to conventionally known compositions.

While the invention has been described in detail and with reference to specific examples thereof, it will be apparent to one skilled in the art that various changes and modifications can be made therein without departing from the spirit and scope thereof.

What is claimed is:

1. A photopolymerizable composition capable of being developed with an aqueous alkali solution, comprising
   (1) a carboxyl group-containing polymer binder,
   (2) a photopolymerization initiator system containing a lophine dimer, and
   (3) a carboxy group-containing compound having the weight-average molecular weight of from more than 300 to about 1,000 represented by formula (Ia) or (Ib):

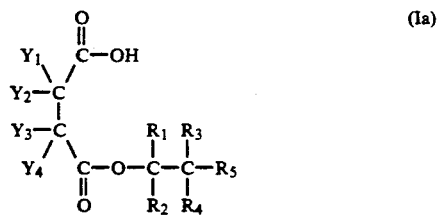

(Ia)

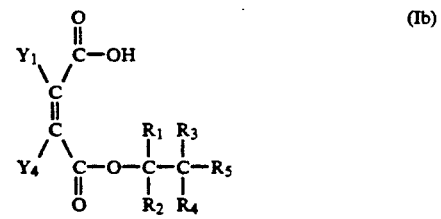

(Ib)

wherein
$Y_1$, $Y_2$, $Y_3$, and $Y_4$, which may be the same or different, each represents a hydrogen atom, a halogen atom an alkyl group having from 1 to 12 carbon atoms, or an aryl group having from 6 to 10 carbon atoms, and with respect to formula (Ib), $Y_1$ and $Y_4$ may form an aromatic hydrocarbon ring having from 6 to 10 carbon atoms, wherein the aromatic hydrocarbon ring may have a carboxy group directly bonded thereto, and wherein
$R_1$, $R_2$, $R_3$, $R_4$, and $R_5$ each represents a hydrogen atom, an alkyl group having from 1 to 12 carbon atoms, an aryl group having from 6 to 10 carbon atoms, a hydroxyalkyl group having from 1 to 12 carbon atoms, an alkyl group having from 1 to 6 carbon atoms substituted by an alkoxy group having from 1 to 12 carbon atoms or an aryloxy group having from 6 to 10 carbon atoms, A—O—$R_6$— or A—O— (wherein A represents a (meth)acryloyl group and $R_6$ represents an alkylene group having from 1 to 6 carbon atoms or an alkylene glycol group having from 2 to 40 carbon atoms), and
(4) photopolymerizable monomer.

2. The photopolymerizable composition as in claim 1, wherein said carboxy group-containing polymer binder has a weight-average molecular weight of about 40,000 to 85,000.

3. The photopolymerizable composition as in claim 1, wherein said carboxy group-containing polymer binder is a methyl methacrylate/methacrylic acid/2-ethylhexyl acrylate/benzyl methacrylate copolymer.

4. The photopolymerizable composition as in claim 1, wherein said carboxy group-containing polymer binder is present in an amount of from 40 to 90% by weight, based on the amount of solid components of the photopolymerizable composition.

5. The photopolymerizable composition as in claim 4, wherein the amount of the carboxy group-containing polymer binder present is from 50 to 70% by weight.

6. The photopolymerizable composition as in claim 1, wherein said photopolymerization initiator system further contains at least one kind of component having a molecular extinction coefficient of at least about 50 in a wavelength range of from about 300 to 800 nm.

7. The photopolymerizable composition as in claim 6, wherein the wavelength range is from about 330 to 500 nm.

8. The photopolymerizable composition as in claim 7, wherein said photopolymerization initiator system is present in an amount of from 0.1 to 20% by weight, based on the amount of solid components of the photopolymerizable composition.

9. The photopolymerizable composition as in claim 8, wherein the amount of the photopolymerization initiator system present is from 0.2 to 10% by weight.

10. The photopolymerizable composition as in claim 6, wherein said photopolymerization initiator system is present in an amount of from 0.1 to 20% by weight, based on the amount of solid components of the photopolymerizable composition.

11. The photopolymerizable composition as in claim 10, wherein the amount of the photopolymerization initiator system present is from 0.2 to 10% by weight.

12. The photopolymerizable composition as in claim 1, wherein said lophine dimer is present in an amount of from 0.1 to 20% by weight, based on the amount of solid components of the photopolymerizable composition.

13. The photopolymerizable composition as in claim 12, wherein the amount of the lophine dimer present is from 0.2 to 10% by weight.

14. The photopolymerizable composition as in claim 1, wherein said compound represented by formula (Ia) or (Ib) is present in an amount of from 0.1 to 40% by weight, based on the amount of solid components of the photopolymerizable composition.

15. The photopolymerizable composition as in claim 14, wherein the amount of the compound represented by formula (Ia) or (Ib) present is from 0.2 to 20% by weight.

16. The photopolymerizable composition as in claim 1, wherein said photopolymerizable monomer is a (meth)acrylic acid ester monomer.

17. The photopolymerizable composition as in claim 1, wherein said photopolymerizable monomer is present in a amount of from 10 to 60% by weight, based on the amount of solid components of the photopolymerizable composition.

18. The photopolymerizable composition as in claim 17, wherein the amount of the photopolymerizable monomer present is from 25 to 50% by weight.

* * * * *